US012682140B2

(12) United States Patent
Hummelshøj et al.

(10) Patent No.: US 12,682,140 B2
(45) Date of Patent: Jul. 14, 2026

(54) QUANTUM MECHANICAL HAMILTONIAN LEARNING AND TEMPORAL PROPERTY PREDICTION

(71) Applicant: Toyota Research Institute, Inc., Los Altos, CA (US)

(72) Inventors: Jens Strabo Hummelshøj, Millbrae, CA (US); Santosh K. Suram, Mountain View, CA (US)

(73) Assignees: Toyota Research Institute, Inc., Los Altos, CA (US); Toyota Jidosha Kabushiki Kaisha, Toyota (JP)

( * ) Notice: Subject to any disclaimer, the term of this patent is extended or adjusted under 35 U.S.C. 154(b) by 905 days.

(21) Appl. No.: 17/992,040

(22) Filed: Nov. 22, 2022

(65) Prior Publication Data
US 2024/0169125 A1    May 23, 2024

(51) Int. Cl.
*G06F 30/27* (2020.01)
*G06N 10/60* (2022.01)

(52) U.S. Cl.
CPC ............. *G06F 30/27* (2020.01); *G06N 10/60* (2022.01)

(58) Field of Classification Search
CPC ................................ G06N 10/60; G06F 30/27
See application file for complete search history.

(56) References Cited

U.S. PATENT DOCUMENTS

| | | | | |
|---|---|---|---|---|
| 11,274,929 | B1 * | 3/2022 | Afrouzi | ..................... G06T 7/30 |
| 2020/0381085 | A1 | 12/2020 | Jippo | |
| 2021/0081834 | A1 | 3/2021 | Hegde | |
| 2024/0005192 | A1 * | 1/2024 | Chen | ........................ G06F 17/15 |
| 2024/0346210 | A1 * | 10/2024 | Yu | ............................ G06F 30/27 |
| 2025/0181950 | A1 * | 6/2025 | Elfving | .................. G06N 20/10 |

OTHER PUBLICATIONS

Schuld, M. (2021). Supervised quantum machine learning models are kernel methods. arXiv preprint arXiv:2101.11020. (Year: 2021).*
Schutt et al., "Unifying machine learning and quantum chemistry with a deep natural network for molecular wavefunctions", Nature Communications, 2019, in 10 pages.

(Continued)

*Primary Examiner* — Bijan Mapar
(74) *Attorney, Agent, or Firm* — Christopher G. Darrow; Darrow Mustafa PC

(57) ABSTRACT
A machine learning system for predicting a time dependent property of a material system includes a processor and a memory communicably coupled to the processor. Stored in the memory is an acquisition module and a machine learning module. The machine learning module includes instructions that, when executed by the processor, cause the processor during each of one or more iterations, to train a machine learning model to learn an initial state vector, Hermitian operators encoding observables, and a Hamiltonian of a material system from the Schrödinger equation of the material system propagated in a time series. The machine learning model also predicts, based at least in part on the learned initial state vector, Hermitian operators, and Hamiltonian, at least one time dependent property of the material system at time not equal to zero.

20 Claims, 4 Drawing Sheets

(56)            References Cited

OTHER PUBLICATIONS

Bai et al., "Graph Neutral Network for Hamiltonian-Based Material Property Prediction", Neural Computing and Applications, vol. 34, May 27, 2020, pp. 4625-4632.

Wang et al., "Experimantal quantum Hamiltonian learning", Nature Physics, vol. 13, Mar. 13, 2017, pp. 551-555.

Gentile et al., "Learning models of quantum systems from experiments", Nature Physics, vol. 17, Feb. 14, 2020, pp. 837-843.

Schmidt et al., "Recent advances and applications of machine learning in solid-state materials science", npj Computational Materials, vol. 5, No. 83, 2019, pp. 1-36.

* cited by examiner

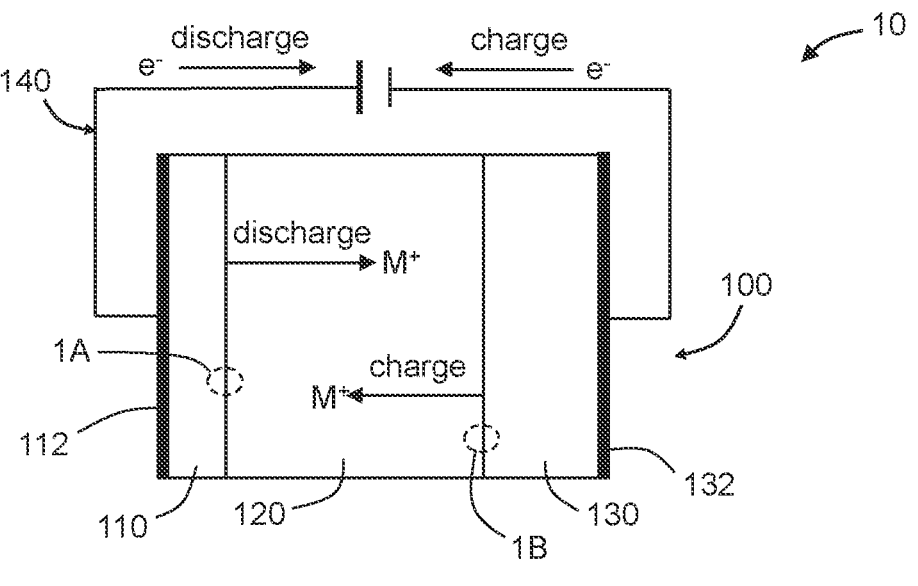
FIG. 1
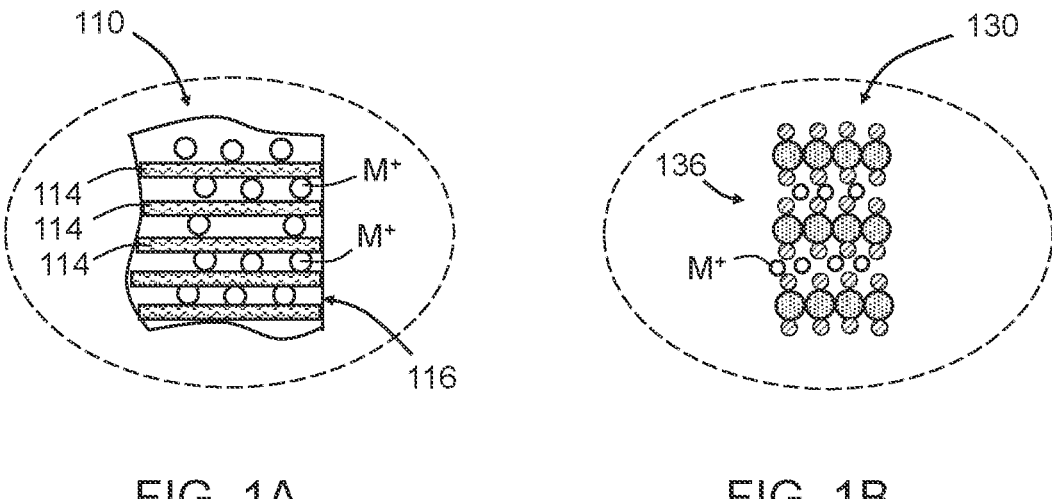
FIG. 1A                    FIG. 1B

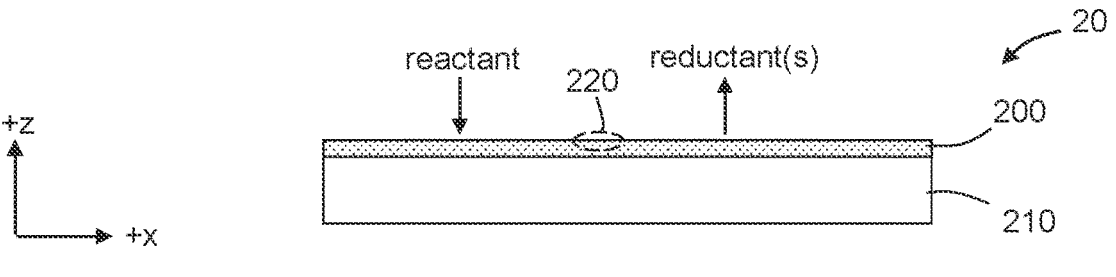
FIG. 2
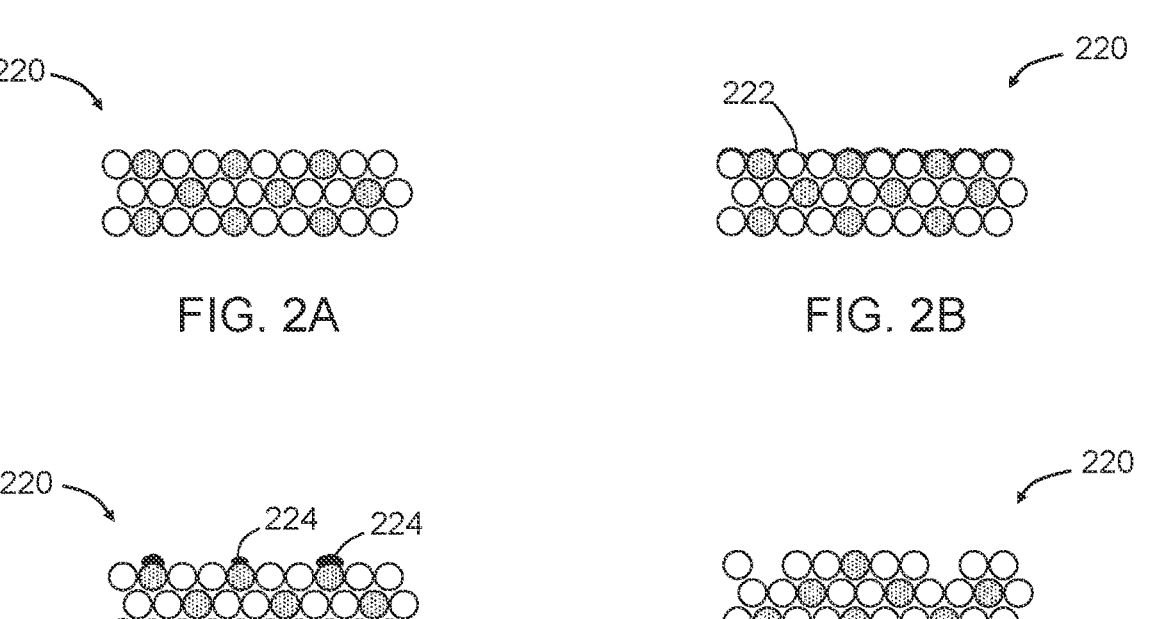
FIG. 2A          FIG. 2B
FIG. 2C          FIG. 2D

QUANTUM MECHANICAL HAMILTONIAN LEARNING AND TEMPORAL PROPERTY PREDICTION

TECHNICAL FIELD

The present disclosure relates generally to machine learning a time dependent property of a material system, and particularly to machine learning an initial state vector of the material system, a Hermitian operator encoding observables of the material system, and a Hamiltonian of the material system in order to predict a time dependent property of the material system.

BACKGROUND

The discovery of new materials and/or unknown properties of existing materials is desirable for continued technological developments in industries such as automotive, aerospace, energy production, chemical processing, and semiconductor manufacturing, among others. Also, the desire for such discoveries has fueled first-principle computational research in an effort to reduce the time and cost associated with materials development. And while first-principle computational research has led to the development of new alloys and semiconductors, the computation time needed for such first-principle calculations can be longer than desired and/or not practical. Accordingly, materials development has seen a rapid increase in machine learning techniques to assist in the discovery of new materials and/or identify properties of known materials. However, machine learning techniques typically fail to take advantage of first-principal concepts and/or formulations to assist in materials development.

The present disclosure addresses issues related to machine learning using first-principal formulations, and other issues related to machine learning.

SUMMARY

This section provides a general summary of the disclosure, and is not a comprehensive disclosure of its full scope or all of its features.

In one form of the present disclosure, a machine learning system for predicting a time dependent property of a material system includes a processor, and a memory communicably coupled to the processor and storing machine-readable instructions that, when executed by the processor, cause the processor to: (1) select a material system from a candidate material system data set and select a training data set from an observables data set; (2) train a machine learning model with observables for the material system to learn: a) an initial state vector; b) Hermitian operators encoding each observable; and c) a Hamiltonian of the material system from a Schrödinger equation of the material system propagated in a time series, wherein the Schrödinger equation of the material system is represented in a Schrödinger picture; and (3) predict, based at least in part on the learned initial state vector of the material system, at least one time dependent property of the material system at time t≠0.

In another form of the present disclosure, a machine learning system for predicting a time dependent property of a material system includes a processor and a memory communicably coupled to the processor. The memory includes a stored acquisition module and a machine learning module. The acquisition module includes instructions that when executed by the processor cause the processor to select a material system from a candidate material system set and select a training data set for the material system from an observable data set by applying a training function to the observable data set. The machine learning module includes instructions that when executed by the processor cause the processor during each of one or more iterations to train a machine learning model with the observables for the material system to learn: a) an initial state vector (i.e., at t=0); b) Hermitian operators encoding each observable; and c) a Hamiltonian of the material system from the Schrödinger equation of the material system propagated in a time series. The Schrödinger equation is represented in the Schrödinger picture of the material system by one of the equations $$|\Psi_S(t)\rangle = \exp\left(-\frac{i\hat{H}t}{\hbar}\right)|\Psi_S(0)\rangle \text{ and } |\Psi_S(t+dt)\rangle = \exp\left(-\frac{i\hat{H}dt}{\hbar}\right)|\Psi_S(t)\rangle,$$

where t is time, dt is a time interval, $|\Psi_s(t)\rangle$ is the state vector of the material system at time t, i is complex number $\sqrt{-1}$, $\hat{H}$ is the Hamiltonian, $\hbar$ is Planck's constant divided by $2\pi$, $|\Psi_s(0)\rangle$ is the state vector of the material system at t=0, $|\Psi_s(t+dt)\rangle$ is the state vector of the material system at time t+dt, and $|\Psi_s(t)\rangle$ is the state vector of the material system at time t. The machine learning module also includes instructions that when executed by the processor cause the processor during each of one or more iterations to predict, based at least in part on the learned state vector of the material system, at least one property of the material system at time t≠0.

In still another form of the present disclosure, a method includes selecting a material system from a candidate material system set and selecting a training data set for the material system from an observable data set. The material system being is selected from the group consisting of a battery material and a catalyst material, and the observable data set contains observables selected from the group consisting of a plurality of states of charge and a plurality of catalyst activity, respectively. The method also includes training a machine learning model with the observables for the material system to learn: a) an initial state vector; b) Hermitian operators encoding each observable; and c) a Hamiltonian of the material system from the Schrödinger equation of the material system propagated in a time series. The Schrödinger equation of the material system is represented in a Schrödinger picture by the equation |

$$|\Psi_S(t)\rangle = \exp\left(-\frac{i\hat{H}t}{\hbar}\right)$$

$|\Psi_s(0)\rangle$ where $|\Psi_s(t)\rangle$ is the state vector of the material system at time t, i is complex number $\sqrt{-1}$, $\hat{H}$ is the Hamiltonian, t is time, $\hbar$ is Planck's constant divided by $2\pi$, and $|\Psi_s(0)\rangle$ is the state vector of the material system at t=0. In some variations, the method includes predicting, based at least in part on the learned state vector of the material system, at least one time dependent property of the material system at time t≠0.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 1 illustrates a secondary battery;

FIG. 1A illustrates a material system for the secondary battery in FIG. 1

FIG. 1B illustrates another material system for the secondary battery in FIG. 1;

FIG. 2 illustrates a catalyst with at least one material system;

FIG. 2A illustrates a material system for the catalyst in FIG. 2A in one state;

FIG. 2B illustrates the material system in FIG. 2A in another state;

FIG. 2C illustrates the material system in FIG. 2A in still another state;

FIG. 2D illustrates the material system in FIG. 2A in still yet another state;

DETAILED DESCRIPTION

Figure 3:
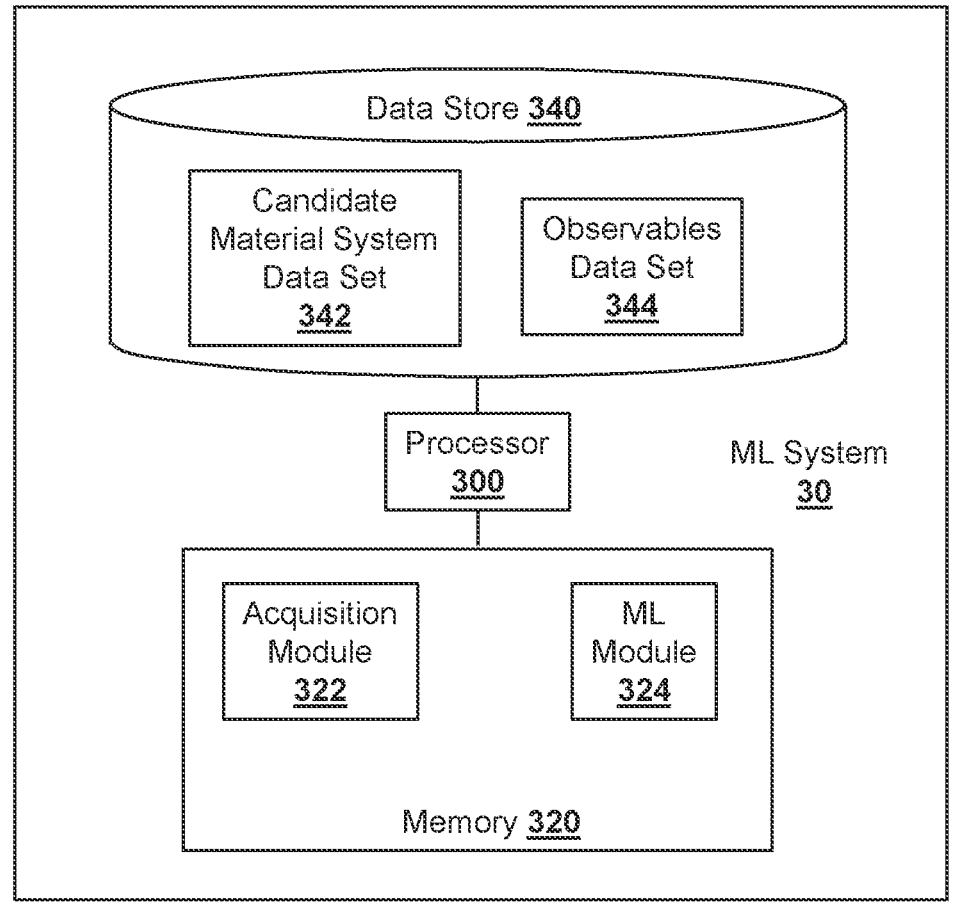
FIG. 3 is a block diagram that illustrates an example of a machine learning system for predicting a state vector and/or a Hamiltonian of a material system according to the teachings of the present disclosure.

The present disclosure provides a machine learning (ML) system and a ML method for predicting at least one property of a material system by training a ML model using the Schrödinger equation for the material system. The ML system and the ML method use observables for the material system to train the ML model to learn an initial state vector of the material system, Hermitian operators encoding the observables, and a Hamiltonian of the material system from the Schrödinger equation propagated in a times series. In this manner, and after learning the initial state vector, the Hermitian operators, and the Hamiltonian from the Schrödinger equation of the material system, the ML system and ML method can predict at least one time dependent (temporal) property of the material system at a time 't'.

It should be understood that a "state vector" of a material system refers to a physical state of the materials system in matrix form, an "initial state vector" refers to a physical state of the materials system at time=0, a "Hermitian operator" refers to an operator corresponding to a real observable (measurement) of the material system, a "Hamiltonian" of a material system refers to an operator corresponding to the total energy of the material system, and a Schrödinger equation of a material system refers to a formulation of the material system (in quantum mechanics) in which either the state vectors in the Schrödinger picture or the operators in the Heisenberg picture evolve in time. It should also be understood that associated with each measurable parameter in a physical system (e.g., material systems disclosed herein) is an operator (i.e., a quantum mechanical operator such as a Hermitian operator)

Referring to FIG. 1 a battery system 10 with at least one material system for which an initial state vector, Hermitian operators and a Hamiltonian of the at least one material system are learned is shown. The battery system 10 includes a secondary (rechargeable) battery 100 (referred to herein simply as "battery") with an anode 110, a cathode 130, and an electrolyte 120 between the anode 110 and the cathode 130. Spaced apart from the electrolyte 120 and in electrical contact with the anode 110 is an anode current collector 112, and spaced apart from the electrolyte 120 and in electrical contact with the cathode 130 is a cathode current collector 132. During discharge of the battery 100, electrons (e⁻) flow through external circuit 140 from the anode 110 to the cathode 130 to produce an electric current while ions (M⁺) flow internally through the electrolyte 120 from the anode 110 to the cathode 130. And during charging of the battery, electrons (e⁻) flow through external circuit 140 from the cathode 130 to the anode 110 while ions (M⁺) flow internally through the electrolyte 120 from the cathode 130 to the anode 110.

Referring to FIGS. 1A-1B, two material systems of the battery system 10 are shown. Particularly, FIG. 1A illustrates a material system in the form of the anode 110 (also referred to herein as "material system 110") and FIG. 1B illustrates a material system in the form of the cathode 130 (also referred to herein as "materials system 130"). Accordingly, in some variations the material system is a battery material. In at least one variation, the material system 110 and/or the material system 130 are in direct or indirect contact with the electrolyte 120. And in some variations the battery includes a material system in the form of the electrolyte 120.

In FIG. 1A the anode 110 includes ions M⁺ (e.g., Li⁺) intercalated in an anode material 114 (e.g., graphite) and in FIG. 1B the cathode 130 includes an M-oxide (e.g., $LiCoO_2$). It should be understood that during storage and/or use of the battery 100, the condition or state of the material system 110 and/or the material system 130 changes with time. Examples of a change of the material system 110 and/or the material system 130 include a change in the concentration of ions M⁺ in the material system 110 and/or the material system 130, a change, either chemically or morphologically, in a surface 116 of the material system 110 and/or a surface 136 of the material system 130 in direct or indirect contact with the electrolyte 120, a change in the spacing of layers (e.g., graphite layers) of the anode material 114 in the material system 110, and a change in the defect structure of the material system 130, among others.

It should be understood that a change in state of the material system 110 and/or the material system 130 can affect a time dependent property of the battery 100 and/or a service life of the battery 100. Also, the battery 100 can be tested with respect to one or more parameters such as time of storage, time of use, load, temperature, number or rechargeable cycles, rate of recharging, rate of discharging, and combinations thereof, among others, and such parameters affect the change in state of the material system 110 and/or the material system 130. It should also be understood that examination, both destructive and non-destructive, of the battery 100 during and/or after such testing can provide observables (i.e., test data) for the battery 100, the material system 110, the electrolyte 120, and the material system 130, and the use of such observables to predict a time dependent property of the battery 100 and/or a service life of the battery 100 is desirable.

Referring to FIG. 2, a catalyst system 20 with at least one material system for which an initial state vector, Hermitian operators and a Hamiltonian of the at least one material system are learned is shown. The catalyst system 20 includes a catalyst layer 200 on a catalyst support 210 and during use of the catalyst system 20 at least one reactant (e.g., $O_2$) is brought into contact with the catalyst layer 200. Also, the catalyst layer 200 (i.e., the catalyst material) functions to enhance at least one chemical reaction (e.g., $O_2+4H^++4e^-$ $=>2H_2O$) such that at least one reductant (e.g., $2H_2O$) is formed or provided.

Referring to FIGS. 2A-2D, non-limiting examples of different states of a material system 220 in the form of three outer (+z direction) atomic layers of the catalyst layer 200 are shown. Accordingly, in some variations the material system is a catalyst material. FIG. 2A illustrates the material system 220 in an initial or pristine state and FIG. 2B illustrates the material system 220 in a prolonged storage state with a thin oxide layer 222 present on an outer surface (+z direction) thereof. FIG. 2C illustrates a poisoned state of the material system 220 with a contaminant 224 on the outer surface and FIG. 2D illustrates a loss of catalytic material state of the material system 220 in which catalytic atoms (e.g., Pt, Ru, among others) are no longer present in the material system 220.

It should be understood that a change in state of the material system 220 affects the performance and/or service life of the catalyst system 20. Also, the catalyst system 20 can be tested with respect to one or more parameters such as time of storage, time of use, temperature of use, reactants exposed to, and combinations thereof, among others. It should also be understood that examination, both destructive and non-destructive, of the catalyst system 20 during and/or after such testing can provide observables (i.e., test data) for the catalyst layer 200 and the material system 220, and the use of such observables to predict a time dependent property (e.g., catalyst activity(ies), catalyst life, among others) of the material system 220 and/or the catalyst system 20 is desirable.

Referring now to FIG. 3, a ML system 30 for predicting at least one time dependent property (i.e., predicting at least one value for a time dependent property) for a material system is illustrated. The ML system 30 is shown including a processor(s) 300, and a memory 320 and a data store 340 communicably coupled to the processor(s) 300. It should be understood that the processor(s) 300 can be part of the ML system 30, or in the alternative, the ML system 30 can access the processor(s) 300 through a data bus or another communication path.

The memory 320 is configured to store an acquisition module 322 and a ML module 324. The memory is a random-access memory (RAM), read-only memory (ROM), a hard-disk drive, a flash memory, or other suitable memory for storing the acquisition module 322 and the ML module 324. Also, the acquisition module 322 and the ML module 324 are, for example, computer-readable instructions that when executed by the processor(s) 300 cause the processor(s) to perform the various functions disclosed herein.

In some variations the data store 340 is a database, e.g., an electronic data structure stored in the memory 320 or another data store. Also, in at least one variation the data store 340 in the form of a database is configured with routines that can be executed by the processor(s) 300 for analyzing stored data, providing stored data, organizing stored data, and the like. Accordingly, in some variations the data store 340 stores data used by the acquisition module 322 and/or the ML module 324. For example, and as shown in FIG. 3, in at least one variation the data store stores a candidate material system data set 342 and an observables data set 344. In some variations the candidate material system data set 342 includes a listing of at least one material system and the observables data set 344 includes observables as a function of time for the at least one material system in the candidate material system data set 342.

Material systems in the candidate material system data set 342 include any material system for which observables are available and/or can be generated. For example, and without limitation, material systems includes anodes, cathodes, electrolytes, anodes in contact with electrolytes, cathodes in contact with electrolytes, anodes plus cathodes in contact with electrolytes, catalyst materials, catalyst materials in contact with reactants, semiconductor materials, semiconductor materials in contact with conductor materials, insulator materials, and insulator materials in contact with conductor materials.

Observables in the observable data set 344 include any observable that is available and/or can be generated for a materials system in the candidate materials system data set 342. For example, and without limitation, observables include time of storage, time or use, temperature of use, cycles of use, time(s) of one of cycles of use, time(s) between one or more cycles of use, applied voltage during use, applied current during use, applied magnetic field during use, reactant(s) of exposure during use, reductant(s) produced during use, and combinations thereof, among others.

The acquisition module 322 can include instructions that function to control the processor(s) 300 to select a material system from the candidate material system data set 342 and select a training data set (i.e., observables) for the selected material system from the observables data set 344. The ML module 324 includes instructions that function to control the processor(s) 300 to use the training data set from the observables data set 344 and to train a ML model to learn an initial state vector, Hermitian operators and a Hamiltonian of the material system. The initial state vector Hermitian operators and Hamiltonian are learned from a Schrödinger equation of the material system propagated in a time series such that the ML module 324 predicts, based at least in part on the learned initial state vector, Hermitian operators, including the Hamiltonian, and at least one time dependent property of the material system at time $t\neq0$. In some variations, the Schrödinger picture can be represented by the equation:

$$|\Psi_S(t)\rangle = \exp\left(-\frac{i\hat{H}t}{\hbar}\right)|\Psi_S(0)\rangle \qquad \text{Eqn. 1}$$

where $|\Psi_s(t)\rangle$ is the state vector of the material system at time t, i is the complex number $\sqrt{-1}$, $\hat{H}$ is the Hamiltonian, t is time, $\hbar$ is Planck's constant divided by $2\pi$, and $|\Psi_s(0)\rangle$ is the initial state vector of the material system at t=0. Observables are calculated as expectation values by the equation:

$$\langle \hat{O} \rangle_{\Psi} = \langle \Psi_s(t)|\hat{O}|\Psi_s(t)\rangle \qquad \text{Eqn. 2}$$

And the state vector and the operators are expressed and learned with respect to an unknown basis with chosen dimensionality, e.g., as a complex normalized vector and a complex Hermitian matrix of numbers. Accordingly, and given observables known for a material system, the temporal evolution of the material system is learned by finding (learning) parameters of Equation 1 that best describe the state vector $|\Psi_s(t)\rangle$ as the Schrödinger picture of the material system is propagated in a time series.

It should be understood that the Schrödinger equation is time dependent, the Hamiltonian $\hat{H}$ for the Schrödinger picture represented by Eqn. 1 is independent of time, and the term exp $$\left(-\frac{i\hat{H}t}{\hbar}\right)$$

in Eqn. 1 is the operator of the initial state vector $|\Psi_s(0)\rangle$ at t=0. Accordingly, the observables (as a function of time) of the material system are used to learn the initial state vector and/or compared to the state vector $|\Psi_s(t)\rangle$ such that the ML model learns the state vector, Hermitian operators encoding the observables, and the Hamiltonian via propagation of the Schrödinger picture in a time series. It should also be understood that the state vector, Hamiltonian, and the Schrödinger picture can be expressed in a matrix mechanics formulation such that the physical properties of the material system are interpreted as matrices that evolve with time. In addition, the matrices can include elements or entries in the form or real numbers and imaginary numbers, and are constrained to be Hermitian.

As noted above, in some variations the Hamiltonian $\hat{H}$ is time independent. However, in other variations the Hamiltonian $\hat{H}$ is assumed to be time dependent and is constant only within a time interval dt. In such variations, and for every interval dt, the ML system 30 learns the Hamiltonian $\hat{H}t,diff$ where $\hat{H}t,diff=\hat{H}t-\hat{H}0$ and $\hat{H}0$ is the Hamiltonian at t=0. In addition, the evolution of state from t to t+dt is given by the equation:

$$|\Psi_S(t+dt)\rangle = \exp\left(-\frac{i\hat{H}dt}{\hbar}\right)|\Psi_S(t)\rangle \qquad \text{Eqn. 3}$$

where $|\Psi_s(t+dt)\rangle$ is the state vector of the material system at time t+dt and $|\Psi_s(t)\rangle$ is the initial state vector of the material system at an initial time t.

Observables are calculated as expectation values by the equation:

$$\langle \hat{O} \rangle_\Psi = \langle \Psi_s(t+dt)|\hat{O}|\Psi_s(t+dt)\rangle \qquad \text{Eqn. 4}$$

And the state vector and the operators are expressed and learned with respect to an unknown basis with chosen dimensionality, e.g., as a complex normalized vector and a complex Hermitian matrix of numbers. Accordingly, and given observables known for a material system, the temporal evolution of the material system is learned by finding (learning) parameters of Equation 3 that best describe the state vector $|\Psi_s(t+dt)\rangle$ as the Schrödinger picture of the material system is propagated in a time series.

The ML model includes any supervised ML model that can learn the initial state vector, Hermitian operators, Hamiltonian of a material system. Non-limiting examples of such ML models include as nearest neighbor models, Naïve Bayes models, decision tree models, linear regression models, support vector machine (SVM) models, and neural network models, among others. In at least one variation, the ML model is a Gaussian process regression model.

Figure 4:
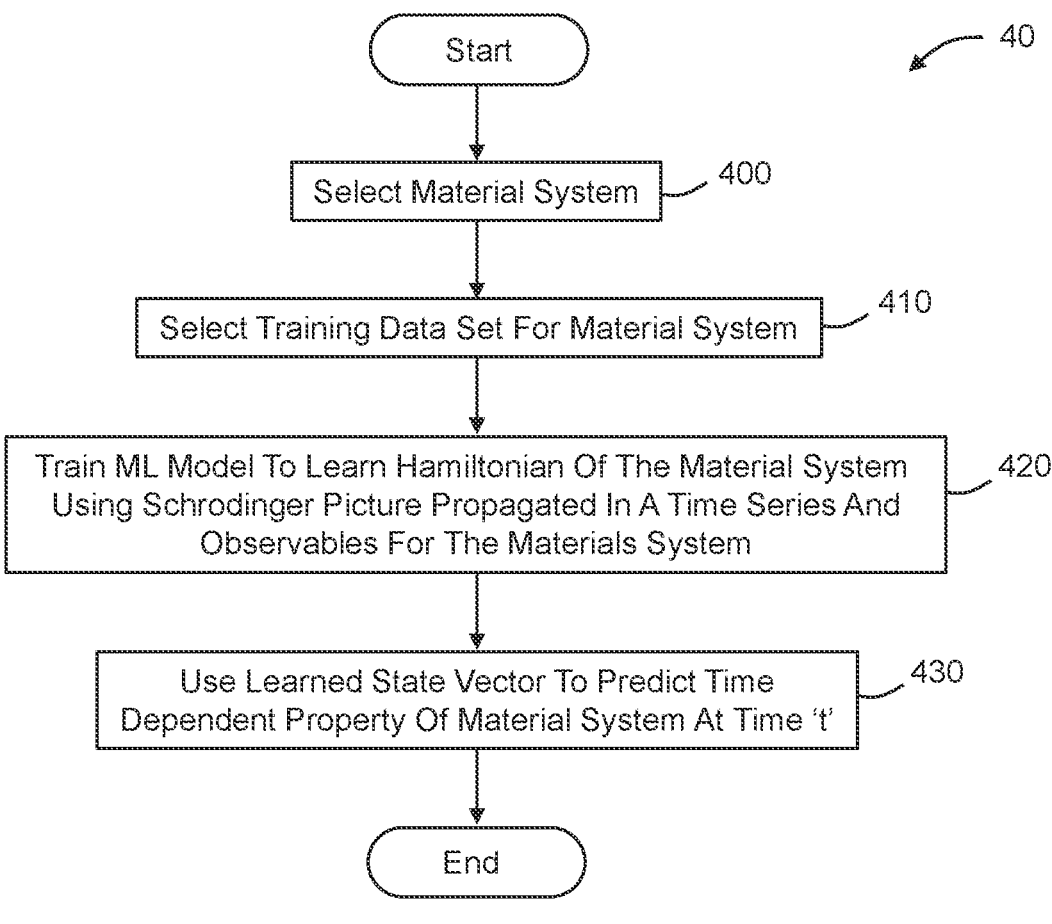
FIG. 4 is a flow chart for a machine learning method using the system illustrated in FIG. 3 to predict a state vector of a material system according to the teachings of the present disclosure.

Referring now to FIG. 4, a flow chart for a ML method 40 according to one form of the present disclosure is shown. The ML method 40 includes selecting a material system at 400, selecting a training data set for the selected material system at 410, and training a ML model to learn an initial state vector, Hermitian operators, and Hamiltonian of the material system using the Schrödinger equation of the material system propagated in a time series and the training data set of the material system at 420. In some variations, and after learning the initial state vector, Hermitian operators, and Hamiltonian, the ML method predicts at least one property of the material system at a time 't' at 430. In at least one variation the training data set can be selected from the observables data set by applying a training function to the observables data set. For example, the training function can include instructions to select the training data set based on at least one of a random selection and an expert analysis.

In some variations the selected material system is at least one of an anode, a cathode, an electrolyte, an anode in contact with an electrolyte, a cathode in contact with an electrolyte, an anode and a cathode in contact with an electrolyte, a catalyst material, a catalyst layer, a catalyst particle, a catalyst material in contact with at least one reactant, a catalyst layer in contact with at least one reactant, a catalyst particle in contact with at least one reactant, a semiconductor material, a semiconductor material in contact with a conductor material, an insulator material, and an insulator material in contact with a conductor material, and combinations thereof, among others. And in at least one variation, the training data set (i.e., observables) includes at least one of time of storage, time or use, temperature of use, cycles of use, time(s) of one or more cycles of use, time(s) between one or more cycles of use, applied voltage during use, applied current during use, applied magnetic field during use, reactant(s) of exposure during use, reductant(s) produced during use, catalyst activity(ies), and combinations thereof, among others.

As noted above, in some variations the ML method 40 proceeds to 430 where the ML method 40 predicts, based at least in part on the learned initial state vector, Hermitian operators, and Hamiltonian, at least time dependent property of the material system at time t≠0. For example, and with reference to Equation 1, the state vector $|\Psi_s(t)\rangle$ can be predicted at time 't' for the selected material system by using the operator exp $$\left(-\frac{i\hat{H}t}{\hbar}\right)$$

on the initial state vector $|\Psi_s(0)\rangle$. And given the predicted state vector $|\Psi_s(t)\rangle$ at time 't', a time dependent property at time 't' is predicted at 430 using Equation 2.

The preceding description is merely illustrative in nature and is in no way intended to limit the disclosure, its application, or uses. Work of the presently named inventors, to the extent it may be described in the background section, as well as aspects of the description that may not otherwise qualify as prior art at the time of filing, are neither expressly nor impliedly admitted as prior art against the present technology.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The flowcharts and block diagrams in the figures illustrate the architecture, functionality, and operation of possible implementations of systems, methods, and computer program products according to various embodiments. In this regard, a block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a ROM, an EPROM or flash memory, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Generally, modules as used herein include routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an ASIC, a hardware component of a system on a chip (SoC), as a programmable logic array (PLA), or as another suitable hardware component that is embedded with a defined configuration set (e.g., instructions) for performing the disclosed functions.

Program code embodied on a computer-readable medium may be transmitted using any appropriate medium, including but not limited to wireless, wireline, optical fiber, cable, radio frequency (RF), etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should be also understood that the various method steps discussed herein do not have to be carried out in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A system comprising:

a processor; and a memory communicably coupled to the processor and storing machine-readable instructions that, when executed by the processor, cause the processor to:

select a material system from a candidate material system data set and select a training data set from an observables data set;

train a machine learning model with observables for the material system to learn: a) an initial state vector; b) Hermitian operators encoding each observable; and c) a Hamiltonian of the material system from a Schrödinger equation of the material system propagated in a time series, wherein the Schrödinger equation of the material system is represented in a Schrödinger picture; and predict, based at least in part on the learned initial state vector of the material system, at least one time dependent property of the material system at time $t \neq 0$.

2. The system according to claim 1, wherein the Schrödinger equation of the material system is:

$$|\Psi_S(t)\rangle = \exp\left(-\frac{i\hat{H}t}{\hbar}\right)|\Psi_S(0)\rangle$$

where $|\Psi_s(t)\rangle$ is the state vector of the material system at time t, i is complex number $\sqrt{-1}$, $\hat{H}$ is a Hamiltonian, t is time, $\hbar$ is Planck's constant divided by $2\pi$, and $|\Psi_s(0)\rangle$ is the state vector of the material system at t=0.

3. The system according to claim 2 further comprising training the machine learning model to learn the Hamiltonian $\hat{H}$ with the training data set for the material system.

4. The system according to claim 1, wherein the Schrödinger equation of the material system is:

$$|\Psi_S(t + dt)\rangle = \exp\left(-\frac{i\hat{H}dt}{\hbar}\right)|\Psi_S(t)\rangle$$

where dt is a time interval, $|\Psi_s(t{+}dt)\rangle$ is the state vector of the material system at time t+dt, i is complex number $\sqrt{-1}$, $\hat{H}$ is a Hamiltonian, t is time, $\hbar$ is Planck's constant divided by $2\pi$, and $|\Psi_s(t)\rangle$ is the state vector of the material system at time t.

5. The system according to claim 4 further comprising training the machine learning model to learn the Hamiltonian $\hat{H}$ with the training data set for the material system for every timer interval dt.

6. The system according to claim 1, wherein the material system includes a battery material and the training data set include a plurality of states of charge.

7. The system according to claim 6, wherein the plurality of states of charge include states of charge as a function of time.

8. The system according to claim 6, wherein the plurality of states of charge include states of charge as a function of load.

9. The system according to claim 6, wherein the plurality of states of charge include states of charge as a function of time and load.

10. The system according to claim 9, wherein the at least one time dependent property of the material system is service life of the material system.

11. The system according to claim 1, wherein the material system includes a catalyst material and the training data set includes a plurality of catalyst activities.

12. The system according to claim 11, wherein the plurality of catalyst activities include catalyst activities as a function of time.

13. The system according to claim 11, wherein the plurality of catalyst activities include catalyst activities as a function of reactant.

14. The system according to claim 11, wherein the plurality of catalyst activities include catalyst activities as a function of time and reactant.

15. The system according to claim 11, wherein the plurality of catalyst activities includes catalyst activities as a function of time for which the catalyst material is not exposed to a reactant.

16. The system according to claim 11, wherein the plurality of catalyst activities includes catalyst activities as a function of time for which the catalyst material is exposed to a reactant.

17. The system according to claim 11, wherein the at least one time dependent property of the material system is catalyst life of the material system.

18. A system comprising:

a processor; and a memory communicably coupled to the processor, the memory storing:

an acquisition module including instructions that when executed by the processor cause the processor to select a material system from a candidate material system set and select a training data set for the material system from an observable data set by applying a training function to the observable data set;

a machine learning module including instructions that when executed by the processor cause the processor during each of one or more iterations, to:

train a machine learning model with the observables for the material system to learn: a) an initial state vector; b) Hermitian operators encoding each observable; and c) a Hamiltonian of the material system from a Schrödinger equation of the material system propagated in a time series, wherein the Schrödinger equation of the material system is represented in a Schrödinger picture by one of the equations:

$$|\Psi_S(t)\rangle = \exp\left(-\frac{i\hat{H}t}{\hbar}\right)|\Psi_S(0)\rangle$$

-continued and $$|\Psi_S(t+dt)\rangle = \exp\left(-\frac{i\hat{H}dt}{\hbar}\right)|\Psi_S(t)\rangle$$

where t is time, dt is a time interval, $|\Psi_s(t)\rangle$ is the state vector of the material system at time t, i is complex number $\sqrt{-1}$, $\hat{H}$ is the Hamiltonian, $\hbar$ is Planck's constant divided by $2\pi$, $|\Psi_s(0)\rangle$ is the state vector of the material system at t=0, $|\Psi_s(t+dt)\rangle$ is the state vector of the material system at time t+dt, and $|\Psi_s(t)\rangle$ is the state vector of the material system at time t; and predict, based at least in part on the learned initial state vector of the material system, at least one property of the material system at time t≠0.

19. The system according to claim 18, wherein the material system is selected from the group consisting of a battery material and a catalyst material, and observables in the training data set are selected from the group consisting of a plurality of states of charge and a plurality of catalyst activities, respectively, and the plurality of states of charge include the states of charge as a function of time and load, and the plurality of catalyst activities include catalyst activities as a function of time and reactant.

20. A method comprising:

selecting a material system from a candidate material system set;

selecting a training data set for the material system from an observable data, the material system being selected from the group consisting of a battery material and a catalyst material, and the observable data set containing observables selected from the group consisting of a plurality of states of charge and a plurality of catalyst activities;

training a machine learning model with observables for the material system to learn: a) an initial state vector; b) Hermitian operators encoding each observable; and c) a Hamiltonian of the material system from a Schrödinger equation of the material system propagated in a time series, wherein the Schrödinger equation of the material system is represented in a Schrödinger picture by the equation:

$$|\Psi_S(t)\rangle = \exp\left(-\frac{i\hat{H}t}{\hbar}\right)|\Psi_S(0)\rangle$$

where $|\Psi_s(t)\rangle$ is the state vector of the material system at time t, i is complex number $\sqrt{-1}$, $\hat{H}$ is the Hamiltonian, t is time, $\hbar$ is Planck's constant divided by $2\pi$, and $|\Psi_s(0)\rangle$ is the state vector of the material system at t=0; and predicting, based at least in part on the learned state vector of the material system, at least one time dependent property of the material system at time t≠0.

* * * * *